United States Patent [19]

Jedicka et al.

[11] Patent Number: 5,530,278
[45] Date of Patent: Jun. 25, 1996

[54] SEMICONDUCTOR CHIP HAVING A DAM TO PREVENT CONTAMINATION OF PHOTOSENSITIVE STRUCTURES THEREON

[75] Inventors: Josef E. Jedicka, Rochester; Brian T. Ormond, Webster, both of N.Y.

[73] Assignee: Xerox Corporation, Stamford, Conn.

[21] Appl. No.: 427,518

[22] Filed: Apr. 24, 1995

[51] Int. Cl.⁶ .................... H01L 31/0224; H01L 31/0232
[52] U.S. Cl. ................. 257/432; 250/227.23; 257/443; 257/459; 257/667
[58] Field of Search .................. 250/208.1, 208.2, 250/214 R, 214.1, 226, 227.23; 257/99, 431, 432, 433, 443, 448, 459, 786, 667

[56] References Cited

U.S. PATENT DOCUMENTS

| | | | |
|---|---|---|---|
| 4,737,208 | 4/1988 | Bloechle et al. | 156/90 |
| 5,026,667 | 6/1991 | Roberts, Jr. | 437/209 |
| 5,037,779 | 8/1991 | Whalley et al. | 437/211 |
| 5,106,784 | 4/1992 | Bednarz | 437/214 |
| 5,176,971 | 1/1993 | Shimamura et al. | 430/7 |
| 5,300,815 | 4/1994 | Rostoker | 257/786 |
| 5,328,870 | 7/1994 | Marrs | 437/216 |
| 5,422,163 | 6/1995 | Kamiyama et al. | 257/667 |

FOREIGN PATENT DOCUMENTS

| | | | |
|---|---|---|---|
| 0019259 | 1/1991 | Japan | 257/667 |
| 0273476 | 9/1992 | Japan | 257/443 |
| 0226621 | 9/1993 | Japan | 257/448 |

*Primary Examiner*—Peter Toby Brown
*Attorney, Agent, or Firm*—R. Hutter

[57] ABSTRACT

In dicing of semiconductor chips from a wafer and mounting of the chips in an apparatus, techniques ensure the integrity of bonding pads and wire bonds in the dicing of individual chips and the connection of wire bonds to the chips. The wire bonds in the undiced chips are each connected to a probe pad disposed in an inter-chip area on the wafer, and this probe pad is used to accept probe pins which may otherwise damage the bonding pads on the chips themselves. In the dicing step, the probe pads are obliterated by the cutting blade. A polyimide dam disposes adjacent the bonding pads restricts the migration of liquid encapsulant securing the wire bonds to the bonding pads.

6 Claims, 2 Drawing Sheets

FIG. 1
PRIOR ART
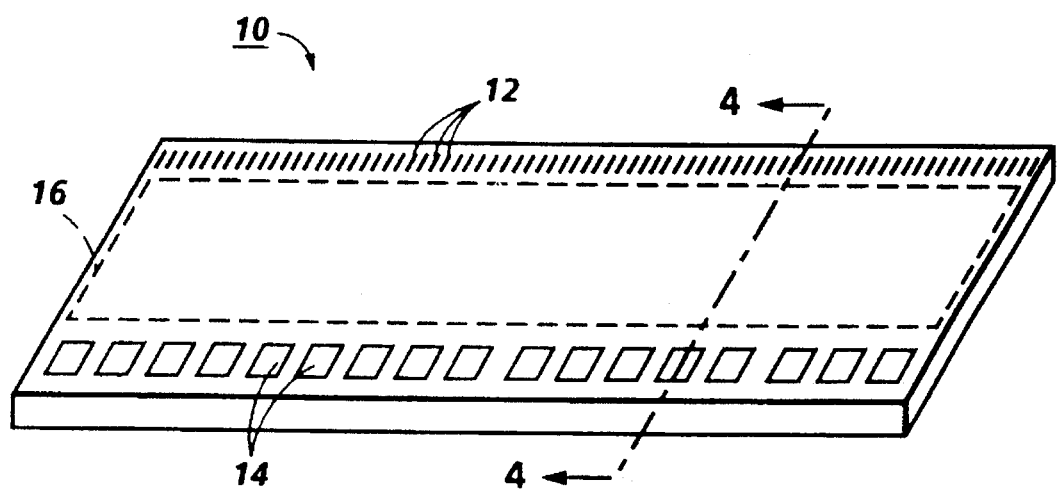
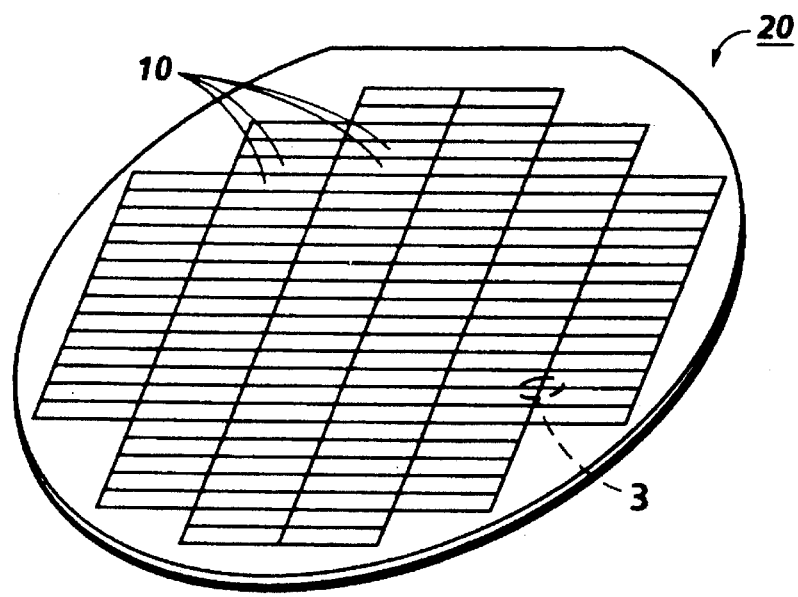
FIG. 2

FIG. 3
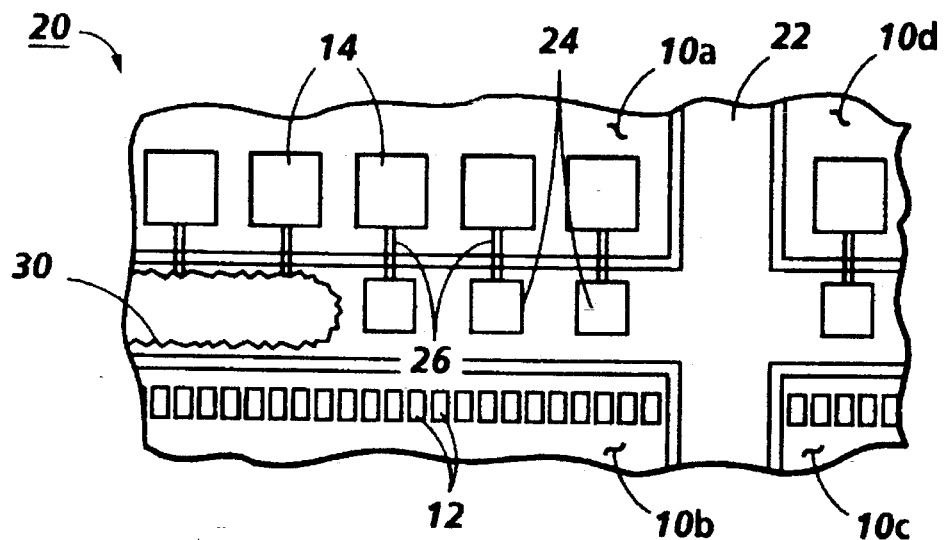
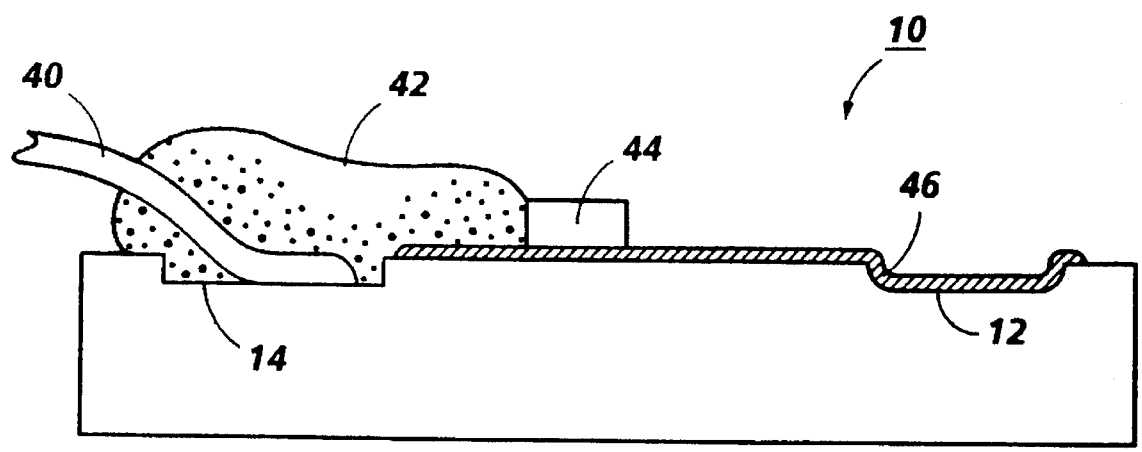
FIG. 4

SEMICONDUCTOR CHIP HAVING A DAM TO PREVENT CONTAMINATION OF PHOTOSENSITIVE STRUCTURES THEREON

The present invention relates generally to semiconductor chips which are diced from a wafer and mounted on a substrate.

Image sensors for scanning document images, such as charge coupled devices (CCDs), typically have a row or linear array of photosites together with suitable supporting circuitry integrated onto a silicon chip. Usually, a sensor is used to scan line by line across the width of a document with the document being moved or stepped lengthwise in synchronism therewith. A typical architecture for such a sensor array is given, for example, in U.S. Pat. No. 5,153,421.

In a full-page-width image scanner, there is provided a linear array of small photosensors which extends the full width of an original document, such as 11 inches. These photosensors may be spaced as finely as 600 to the inch on each chip. When the original document moves past the linear array, each of the photosensors converts reflected light from the original image into electrical signals. The motion of the original image perpendicular to the linear array causes a sequence of signals to be output from each photosensor, which can be converted into digital data.

A currently-preferred design for creating such a long linear array of photosensors is to provide a set of relatively small semiconductor chips, each semiconductor chip defining thereon a linear array of photosensors along with ancillary circuit devices. These chips are typically approximately ¾ inches in length; in order to create a practical full-page-width array, as many as twenty or more of these chips can be abutted end-to-end to form a single linear array of photosensors. The abutted chips are typically mounted on a support platform. This support platform also includes circuitry, such as on a printed wire board, which accesses the circuit devices on the individual chips for a practical system. The interconnections between the relatively large-scale conductors on the printed wire board and the relatively small contact pads on the semiconductor chips are preferably created by wire bonds which are ultrasonically welded to both the printed wire board conductors and to contact pads on the chips.

In the crucial steps of attaching wire bonds from external circuitry to bonding pads on the individual chips forming the chip array, and then encapsulating those wire bonds, two significant practical problems have been encountered. First, in an intermediate testing step between the creation of the chips and the attaching of wire bonds thereto, the individual chips are tested by probing the circuitry thereon through the bonding pads. In the testing step, temporary connections are made to the bonding pads with needle-like conductors which are touched to the bonding pads. However, it has been found that this "probing" in the testing step often scuffs or otherwise damages the bonding pads. It is preferable to be able to attach a wire bond in the finished chip array to a clean and unscratched bonding pad.

Another significant practical problem occurs when the wire bonds are secured to the appropriate bonding pads with an encapsulant such as silicone. Typically, the wire bond is ultrasonically welded against the appropriate bonding pad, and then a droplet of silicone encapsulant is deposited to encompass the bonding pad and the wire bond. The silicone is then caused to harden, such as by thermal curing. However, when the wire bonding technique is used with a chip having photosensors thereon, it is not uncommon that excess silicone encapsulant migrates from the bonding pad to the photosensors before the encapsulant hardens. Contamination of the photosensors by even a clear encapsulant will of course result in either damage to the photosensors or the disruption of light directed to the photosensors.

In the prior art, U.S. Pat. No. 4,737,208 discloses a method for laminating multilayer structures with nonplanar surfaces, such as cavities, formed thereon. Special conformal and release material are provided over the structure prior to lamination bonding. The materials fill the cavity during the bonding operation to prevent flow of adhesive from between the layers into the cavity.

U.S. Pat. No. 5,026,667 discloses wire-bonded chips which are coated with polyimide or acrylic and cured to a hardened state. The coating is applied over portions of the circuitry which are stress-sensitive, but spaced away from the wire-bond regions of the chip.

U.S. Pat. No. 5,037,779 discloses a capillary fill encapsulation technique, wherein a selected region of a semiconductor device is encapsulated while other regions of the device are left uncovered. The patent discloses, at FIG. 7 thereof, spacers 15 which are used as posts to prevent structures overlaying the chip to prevent bonding wires from being forced into contact with the chip by the overlaying structure.

U.S. Pat. No. 5,106,784 discloses producing a cavity pack around an assembled semiconductor device. The chip includes a chip attach pad having a plurality of straps, each strap extending outwardly from the chip attach pad, so that the chip may be suspended within the package.

U.S. Pat. No. 5,300,815 discloses a technique for increasing the density of bond pads on a chip, wherein non-square bond pads are shaped, sized, and oriented such that each bond pad closely conforms to the shape of the contact footprint made therewith by a bonding wire.

U.S. Pat. No. 5,328,870 discloses an integrated circuit package including a heat sink. The package incorporates a locking ring located around the heat sink to provide a better seal between the encapsulant and heat sink.

According to one aspect of the present invention, there is provided a semiconductor chip, comprising an imaging structure and a bonding pad, each disposed on a first surface of the chip. A dam is disposed on the first surface of the chip between the imaging structure and the bonding pad, adapted to prevent flow of fluid encapsulant from the bonding pad to the imaging structure.

According to another aspect of the present invention, there is provided a method of making a semiconductor device, a semiconductor wafer is made defining at least one chip area on a main surface of the wafer. The chip area includes a bonding pad. The wafer further includes a probe pad disposed outside of the chip area, electrically connected to the bonding pad. A portion of the wafer defined by the chip area is separated from the wafer, thereby creating a chip.

As used in the claims herein, the phrase "imaging structure" shall be defined as including any structure which is physically related to the creation or recording of a portion of an image. The definition includes, by way of example and not of limitation, photosites for the recording of an image; ejectors or portions of ejectors for ink-jet printing apparatus; or light-emitting diodes for the selective imagewise charging or discharging of a charge-retentive surface. All of these above-mentioned types of imaging structure can be formed in linear arrays on silicon semiconductor chips.

In the drawings:

FIG. 1 is a perspective view showing a typical chip for use with the present invention, in isolation;

FIG. 2 is a perspective view showing a silicon wafer relevant to the present invention;

FIG. 3 is a plan view of a portion of the main surface of a silicon wafer; and

FIG. 4 is a cross-sectional view through line 4—4 in FIG. 1, with the addition of elements specific to the present invention.

FIG. 1 is a perspective view showing, in isolation, one photosensitive chip 10 relevant to the claimed invention. The chip 10 is generally made of a silicon substrate, as is known in the art, in which circuitry and other elements are formed, such as by photolithographic etching. For purposes of the claimed invention, the most relevant structures are a linear array of photosites 12, each of which forms the photosensitive surface of photosensor circuitry within the chip, and a set of bonding pads 14. The photosites 12 are typically arranged in a linear array along one main dimension of the chip. As mentioned above, a plurality of such chips 10 are aligned so that the linear arrays of photosites 12 from the plurality of chips are arranged to form a single linear array of photosites which may extend, for example, over as many as 20 aligned chips to form a chip array. The bonding pads 14 are distinct clear surfaces on the main surface of the chip 10, and are intended to accept wire bonds attached thereto. The bonding pads 14 thus serve as the electronic interface between the chip 10 and any external circuitry. The circuitry for obtaining signals related to light directed to the photosites 12, and unloading image data from the chip 10 is generally indicated as 16, and is, in the illustrated embodiment, generally disposed between the linear array of photosites 12 and a substantially linear array of bonding pads 14.

Chips such as 10 are typically formed in batches on silicon wafers, which are subsequently cleaved, or "diced," to create individual chips. Thus, all of the photosites, bonding pads and circuitry for relatively large number of chips are etched simultaneously onto a single wafer. A typical silicon wafer which is five inches in diameter may be capable of yielding as many as three hundred chips.

FIG. 2 shows a typical silicon wafer, in isolation, wherein a relatively large number of chips 10 are created in the wafer 20 prior to dicing thereof. It will thus be seen that each individual chip 10 in the main surface of a wafer 20 comprehends a distinct chip area within the main surface of the wafer 20. As used in the claims herein, the phrase "chip area" will refer to a defined area within the main surface of a wafer which is intended to comprise a discrete chip 10 after the dicing step, when individual chips 10 are separated from the rest of the wafer 20.

FIG. 3 is a detailed plan view of the main surface of a wafer such as 20, generally near the intersection of four chip areas corresponding to chips which are indicated as 10a, 10b, 10c, and 10d. Because the chip areas are arrayed on the main surface of wafer 20 much like city blocks, the border sections between adjacent chip areas, which belong to no chip, are conveniently described as "street regions," such as indicated by 22. The dicing process by which individual chips are separated from a wafer is typically performed by a rotating circular diamond blade which is caused to cut between the adjacent chips through the street region 22. Because the diamond blade will have a significant thickness associated therewith, it is typically expected that the street region 22 between adjacent chip areas on a wafer 20 will be essentially obliterated in the dicing process.

In a production situation wherein a batch of chips from a single wafer must be tested before they are selected for use in, for example, a chip array, testing of the circuitry on individual chips 10 is preferably performed before the dicing process. In the pre-dicing testing process, probe pins (not shown) are touched or urged against the bonding pads 14 of a particular chip 10 being tested, and suitable test signals are then sent through the probe pin to one or more bonding pads 14, and the responses of chip circuitry are tested. However, the probe pins which are typically used to connect with the bonding pads of the pre-diced chip are known to scuff or otherwise scratch or damage the bonding pads 14. The scratching of the bonding pads 14 by the probe pin may result in a less satisfactory bond from a wire bond when the chip is installed in a larger apparatus.

In order to avoid damage to bonding pads 14 during a pre-dicing testing step, the present invention proposes providing bonding pads 14 with a "probe pad," here indicated as 24, which is electrically connected to an individual bonding pad 14, but which provides a contact area within the street region 22. The probe pad 24 may be connected to its associated bonding pad 14 by a conductor such as 26. The conductor 26 may be formed on the top surface of the wafer 20, or else can be "buried" in a lower layer of the wafer 20, so that only the area of the probe pad 24 appears in the street region.

It is the intention of the present invention that the probe pads 24 associated with each of the bonding pads 14 for each chip 10 on a wafer 20 be used to accept the probe pins for pre-dicing testing of a selected chip 10. By using the probe pads 24 instead of the bonding pads 14, the bonding pads 14 in the finished chip will not be damaged by the urging of probe pins thereon. Rather, all of the scratching and other damage caused by the probe pins will be directed to the probe pads 24. Because the probe pads 24 are located in the street region 22 and not within the chip area of a given chip 10, any damage to the probe pads 24 will have no effect on the chip 10 after the chip 10 is separated from the wafer 20 in the dicing process. As shown in FIG. 3, the dicing cut in street region 22, which is shown as the jagged removed area 30 as a rotating blade (not shown) progresses through the street region 22, obliterates the probe pads 24 in the dicing process. When the chip 10 is separated from the rest of wafer 20, the bonding pads 14 thereon remain untouched.

Once the chip 10 which has been selected for installation in a chip array or other structure is separated from the wafer 20, it must be installed in a larger apparatus and electrically connected to external circuitry through the bonding pads 14 thereof. A typical technique for attaching a wire bond from external circuitry to a particular bonding pad 14 is to place a droplet of encapsulant, such as liquid silicone, on the area where the wire bond touches the bonding pad 14. In the case of chips 10 with photosites 12 thereon, a practical problem occurs when the liquid encapsulant migrates along the main surface of the chip and covers the photosites. According to the present invention, there is provided a dam disposed between a bonding pad 14 and a photosite 12 on a chip 10, which acts to prevent the flow of the fluid encapsulant from the bonding pad to the photosite.

FIG. 4 is a cross-sectional view, through line 4—4 of FIG. 1, showing a typical chip 10 upon installation in a larger apparatus. A wire bond 40, which is connected to some external circuitry, is placed in contact with the conductive surface of bonding pad 14, and further may be ultrasonically welded thereto. The wire bond 40 is secured to the main surface of bonding pad 14 by a droplet of encapsulant 42. Typically, the encapsulant 42 is placed on the wire bond 40 and bonding pad 14 while in a liquid state, and then caused to harden, such as by heat curing, as is known in the art. In order to prevent migration of the encapsulant 42 before it hardens elsewhere on the chip, there is provided, according to the present invention, a dam 44, which is disposed between the linear array of bonding pads 14 and the linear array of photosites 12. As seen in FIG. 4, the dam 44 restrains the droplet of encapsulant 42.

A preferred material for forming the dam 44 is a strip of polyimide which is attached to the main silicon surface of chip 10. A typical height required for the polyimide dam is from 1.5 to 2 micrometers from the main surface of the chip 10.

In some versions of a photosensitive chip, there may also be provided a filter layer, such as 46, formed of translucent polyimide which is deposited over one or more of the photosites 12 in the linear array. This filter layer is used to filter out one or more colors to affect the recording of color images, or for other general purposes such as to filter out unwanted infrared light. When a filter layer such as 46 is placed on the surface of chip 10, it is typically preferred to place the dam 44 over the polyimide of the filter layer 46, as shown. However, it is certainly possible, if the distribution of the filter polyimide of 46 is limited to only the photosite areas, that the polyimide 44 should attach directly to the bare silicon of the chip 10.

Extension of the polyimide filter layer 46, as shown in FIG. 4, may also help in limiting encapsulant migration on the chip. In the particular embodiment shown in FIG. 4, the portion of the filter layer 46 which extends to the left of dam 44 in the Figure may have some effect in causing the encapsulant 42 to bead, and thus slow down its migration, enhancing the effectiveness of dam 44.

While this invention has been described in conjunction with a specific apparatus, it is evident that many alternatives, modifications, and variations will be apparent to those skilled in the art. Accordingly, it is intended to embrace all such alternatives, modifications, and variations as fall within the spirit and broad scope of the appended claims.

We claim:

1. A semiconductor chip, comprising:

an imaging structure, disposed on a first surface of the chip;

a bonding pad, disposed on the first surface of the chip;

a filter layer, in contact with the first surface of the chip; and a dam in contact with the filter layer, disposed between the imaging structure and the bonding pad, adapted to prevent flow of fluid encapsulant from the bonding pad to the imaging structure;

a first portion of the filter layer covering the imaging structure of the chip and a second portion of the filter layer extending from the dam to the bonding pad.

2. The chip of claim 1, the imaging structure and the bonding pad being formed on a silicon substrate.

3. The chip of claim 1, the dam including polyimide.

4. The chip of claim 1, further comprising a wire bond contacting the bonding pad.

5. The chip of claim 4, further comprising an encapsulant, in the form of a hardened fluid, encapsulating the wire bond and the bonding pad.

6. The chip of claim 1, the semiconductor chip comprising a plurality of imaging structures arranged in a linear array, a plurality of bonding pads arranged in a linear array, and wherein the dam extends between the linear array of imaging structures and the linear array of bonding pads.

* * * * *